United States Patent
Doemer et al.

(10) Patent No.: US 11,355,310 B2
(45) Date of Patent: Jun. 7, 2022

(54) METHOD FOR CHANGING THE SPATIAL ORIENTATION OF A MICRO-SAMPLE IN A MICROSCOPE SYSTEM, AND COMPUTER PROGRAM PRODUCT

(71) Applicant: Carl Zeiss Microscopy GmbH, Jena (DE)

(72) Inventors: Holger Doemer, Bopfingen (DE); Andreas Schmaunz, Oberkochen (DE)

(73) Assignee: Carl Zeiss Microscopy GmbH, Jena (DE)

( * ) Notice: Subject to any disclaimer, the term of this patent is extended or adjusted under 35 U.S.C. 154(b) by 0 days.

(21) Appl. No.: 17/203,095

(22) Filed: Mar. 16, 2021

(65) Prior Publication Data
US 2021/0296087 A1   Sep. 23, 2021

(30) Foreign Application Priority Data
Mar. 20, 2020   (DE) .......................... 102020203580.6

(51) Int. Cl.
*H01J 37/26* (2006.01)
*H01J 37/305* (2006.01)

(52) U.S. Cl.
CPC .......... *H01J 37/26* (2013.01); *H01J 37/3056* (2013.01); *H01J 2237/20207* (2013.01); *H01J 2237/31749* (2013.01)

(58) Field of Classification Search
CPC .................... H01J 37/26; H01J 37/3056; H01J 2237/20207; H01J 2237/31749
See application file for complete search history.

(56) References Cited

U.S. PATENT DOCUMENTS

| 6,781,125 B2 | 8/2004 | Tokuda |
| 10,347,461 B2 | 7/2019 | Schmaunz et al. |

(Continued)

FOREIGN PATENT DOCUMENTS

| DE | 10 2017 212 020 B3 | 5/2018 |
| EP | 2 001 038 A2 | 12/2008 |

(Continued)

OTHER PUBLICATIONS

Rauch et al., "Smallest microhouse in the world, assembled on the facet of an optical fiber by origami and welded in the µRobotex nanofactory," J. Vac. Sci. Technol A 36(4), Jul./Aug. 2018.

(Continued)

*Primary Examiner* — Nicole M Ippolito
*Assistant Examiner* — Hanway Chang
(74) *Attorney, Agent, or Firm* — Fish & Richardson P.C.

(57) ABSTRACT

A method is carried out with the aid of a particle beam microscope which includes a particle beam column for producing a beam of charged particles, the particle beam column having an optical axis. Furthermore, the particle beam microscope includes a holding device for holding the extracted micro-sample. The method includes holding the extracted micro-sample and an adjacent hinge element via the holding device. The micro-sample adopts a first spatial orientation relative to the optical axis. The method also includes producing a bending edge in the hinge element by way of irradiation with a beam of charged particles such that the adjacent micro-sample is moved in space and the spatial orientation of the micro-sample is altered. The method further includes holding the micro-sample in a second spatial orientation relative to the optical axis, wherein the second spatial orientation differs from the first spatial orientation.

20 Claims, 8 Drawing Sheets

(56) References Cited

U.S. PATENT DOCUMENTS

| | | |
|---|---|---|
| 2008/0073535 A1 | 3/2008 | Hong et al. |
| 2008/0258056 A1 | 10/2008 | Zaykova-Feldman et al. |
| 2009/0014648 A1 | 1/2009 | Zeile et al. |
| 2015/0214004 A1 | 7/2015 | Pavia |
| 2017/0183772 A1 | 6/2017 | Bargatin |

FOREIGN PATENT DOCUMENTS

| | | |
|---|---|---|
| EP | 2899744 A1 | 7/2015 |
| JP | 2000-0340387 A | 12/2000 |
| JP | 2000340387 A2 | 12/2000 |
| JP | 2002150990 A2 | 5/2002 |
| JP | 2005044817 A2 | 2/2005 |
| JP | 2005203382 A2 | 7/2005 |
| JP | 2005203383 A2 | 7/2005 |
| JP | 2005203384 A2 | 7/2005 |
| JP | 2005259706 A2 | 9/2005 |
| JP | 2005259707 A2 | 9/2005 |
| JP | 2005285776 A2 | 10/2005 |
| JP | 2007123289 A2 | 5/2007 |
| JP | 2007128921 A2 | 5/2007 |
| JP | 2007128923 A2 | 5/2007 |
| JP | 2007184295 A2 | 7/2007 |
| JP | 2008181893 A2 | 8/2008 |
| JP | 2008210811 A2 | 9/2008 |

OTHER PUBLICATIONS

W. Arora et al.; Membrane folding to achieve three-dimensional nanostructures: Nanopatterned silicon nitride folded with stressed chromium hinges, Applied physics letters 88 (2006), p. 053108-1-053108-3.

German Office Action, with translation thereof, for corresponding DE Appl No. 102020203580.6, dated October 28, 2020.

EBSD

Fig. 8B

TKD

Fig. 8C

TKD

Fig. 8D

STEM

METHOD FOR CHANGING THE SPATIAL ORIENTATION OF A MICRO-SAMPLE IN A MICROSCOPE SYSTEM, AND COMPUTER PROGRAM PRODUCT

CROSS-REFERENCE TO RELATED APPLICATION

This application claims benefit under 35 U.S.C. § 119 to German Application No. 10 2020 203 580.6, filed Mar. 20, 2020. The contents of this application is hereby incorporated by reference in its entirety.

FIELD

The disclosure relates to a method for changing the spatial orientation of a micro-sample to be analyzed and/or processed in a microscope system. By way of example, the micro-sample can be a transmission electron microscope (TEM) sample, which is examined in a TEM, or the precursor of a TEM sample, which is initially be processed and/or analyzed in an FIB-SEM combination apparatus.

BACKGROUND

To prepare a micro-sample (also referred to as microscopic sample or just sample), it can be held in certain spatial orientations in the microscope system. The spatial orientation is understood to mean the alignment of the sample. The spatial orientation is usually specified in relation to the optical axes of the microscope system.

Depending on the sample type, the type of examination or processing, or the microscope system employed, it may be desirable to hold the micro-sample in a plurality of different spatial orientations in the microscope system, and so it would be desirable to be able to turn the micro-sample, i.e., change its spatial orientation.

By way of example, the micro-sample can be a TEM lamella. A TEM lamella is understood to mean an electron microscopic sample which has the shape of a flat cuboid.

The cuboid is so thin in at least one region that electrons can pass therethrough. Electrons that have passed through the TEM lamella (so-called transmitted electrons) can then be detected using a suitable detector and can be used to produce an image (a so-called transmission image) of the sample.

Depending on their original relative position in the original material, TEM lamellas can be prepared as a horizontal or vertical TEM lamella. In the case of a vertical lamella, the cut with which the flat side of the lamella is exposed is guided transversely to the sample surface. Such a lamella is also referred to as standard lamella, cross-section lamella or SAXTEM lamella. In order to prepare a vertical lamella, for example, material from a volume sample (original sample) can be ablated using a focused ion beam (FIB), which is produced in an SEM-FIB combination apparatus.

In general, the prepared TEM lamella is then separated from the volume sample and removed by way of a so-called lift out. Special manipulation or holding tools such as micromanipulators or microgrippers are usually used for the lift-out procedure.

The TEM lamella is usually affixed to the needle of a micromanipulator and removed from the volume sample via the manipulator. In the process, the TEM lamella is attached with its original alignment (i.e., vertical, and hence parallel to the optical axis of an electron beam microscope) to the micromanipulator needle. Then, the TEM lamella is extracted from the volume sample, with the TEM lamella maintaining substantially the same alignment as prior to the extraction.

To image the extracted TEM lamella with the aid of an electron beam, for example, it is desirable however to align the TEM lamella substantially perpendicular to the electron beam and hence also perpendicular to the optical axis of the electron beam column. Consequently, it is desirable to alter the spatial orientation of the TEM lamella.

To this end, use can be made of a micromanipulator, in which the micromanipulator needle is rotatable about its longitudinal axis. By rotating the needle, it is possible to turn the lamella fastened thereto, and so now the electron-transparent area of the TEM lamella is aligned perpendicular to the incident electron beam.

Alternatively, changing the spatial orientation of the TEM lamella can be brought about by virtue of the lamella being transferred to a further tool, with the alignment of the lamella being altered during the transfer procedure. The tool can be, for example, a microgripper or a second micromanipulator or any other device which provides an additional degree of freedom of movement, for example a sample stage (stage), a so-called flip stage or a correspondingly oriented sample grid.

These solutions can be expensive, specifically equipped manipulation tools may be used, and, in general, a plurality of affixing and releasing procedures are used, each of which harbors the risk of damaging or losing the lamella. Further, especially formed sample stages or sample holders have been proposed, with the aid of which the orientation of a micro-sample can be altered. Thus, various attachment devices are known, which can be mounted onto a sample stage in order to enable an additional degree of freedom of movement of the sample.

Generally, proposed solutions involve using specifically formed and expensive sample stages and/or sample holders.

It is known that exposed parts of a sample can be subject to particle beam-induced shaping in order to fold the sample out of the plane of the original sample and thus make it accessible for further examinations. Moreover, a so-called self-folding process of thin membranes and films has been described, which is caused by the action of a focused ion beam.

The following is a list of known publications:
JP20000340387
US2008073535 A1
US2008258056 A1
EP2001038
DE 102017212020
Rauch et al. (2018): Smallest Microhouse in the World; J. Vac. Sci. Technol A36(4)

SUMMARY

The present disclosure proposes methods by which it is possible to alter the spatial alignment of a micro-sample in a microscope system.

By way of example, the micro-sample can be a TEM lamella. However, the disclosure is not restricted to TEM samples. Rather, the micro-sample can also be formed as a different type of sample or as a precursor of a TEM lamella. Thus, it is conceivable for the micro-sample to be a sample which should initially be prepared further, for example by thinning and/or polishing with the aid of a focused ion beam.

Here, it can be advantageous if the microscope system is an FIB-SEM combination apparatus (two-beam apparatus). The micro-sample can be processed and/or examined in the FIB-SEM combination apparatus, for example by in situ STEM analyses, in which electrons that have passed through the sample are analyzed.

In a general aspect, the disclosure provides a method for changing the spatial orientation of an extracted micro-sample, carried out with the aid of a particle beam microscope. The particle beam microscope includes a particle beam column for producing a beam of charged particles. The particle beam column has an optical axis. The particle beam microscope also includes a holding device for holding the micro-sample. The method includes the steps of: a) holding the extracted micro-sample and an adjacent hinge element via the holding device, wherein the micro-sample adopts a first spatial orientation relative to the optical axis; b) producing a bending edge in the hinge element by way of irradiation with a beam of charged particles such that the adjacent micro-sample is moved in space and the spatial orientation of the micro-sample is altered; and c) holding the micro-sample in a second spatial orientation relative to the optical axis, wherein the second spatial orientation differs from the first spatial orientation.

The disclosure is based on the discovery that the change in the spatial orientation of a micro-sample can be brought about by a particle beam-induced, contactless shaping of a hinge element. A focused ion beam, for example, can be used as a particle beam. The hinge element is arranged adjacent to the micro-sample between the micro-sample and a holding device, which holds the hinge element and the micro-sample. In this case, the hinge element can be embodied either as a separate element or as a hinge region that is embodied in one piece with the micro-sample and that includes the sample region in which a bending edge is produced by shaping.

The hinge element has the function of a hinge. A hinge is understood to mean a joint that is rotatable about one axis and therefore provides one degree of freedom of movement. Accordingly, the hinge element supplies an additional degree of freedom of movement for the adjacent micro-sample.

To carry out the method according to the disclosure, a micro-sample extracted from an original sample is provided in the sample chamber of a particle beam microscope. The particle beam microscope includes at least one particle beam column, by which a beam of charged particles can be produced. The particle beam column can be embodied as an ion beam column or as an electron beam column. In any case, the particle beam column includes an optical axis along which the charged particles (ions or electrons) produced in the column move.

Moreover, the particle beam microscope includes a holding device, by which the hinge element and the adjacent extracted micro-sample are held. The hinge element can be arranged between the holding device and the micro-sample, and so it therefore interconnects the micro-sample and holding device. The holding device can be embodied as a manipulator needle, gripper, sample holder, stub, or any other suitable device, for example also a second sample.

By way of example, the hinge element can be embodied as a thin film between micro-sample and holding device. In this case, the materials of micro-sample and hinge element may differ.

It is also conceivable for the hinge element and micro-sample to be formed in one piece and include the same or similar material.

Any material in which particle beam-induced shaping can be produced is suitable as a material for the hinge element. The hinge element or the hinge region can have a material thickness of a few tens of nanometers up to several micrometers.

In any case, the bending edge is produced in a region that does not belong to the micro-sample in the strict sense (i.e., the region of the sample which should be subjected to a further examination or further processing).

As a result of the action of a beam of charged particles on the hinge element, the latter is shaped in the direction of the incident particle beam. During the shaping, the adjacent micro-sample is moved in space, and so its spatial orientation is altered. In other words, following the shaping of the hinge element, the micro-sample which is initially held in a first spatial orientation has a second spatial orientation that differs from the first spatial orientation. That is to say, changing the orientation of the micro-sample is brought about by ion beam-induced production of a bending edge in the hinge element.

It is also conceivable for a plurality of bending edges to be produced in the hinge element. The bending edges can be aligned substantially parallel to one another. However, it is also conceivable for the bending edges not to extend parallel to one another. Furthermore, the bending edges, once produced, can be stabilized by the deposition of material.

It was found to be particularly advantageous if the second spatial orientation is chosen in such a way that the micro-sample can be analyzed and/or processed in subsequent method steps, for example by irradiation with an electron beam, thinning and/or polishing with a focused ion beam or by TKD (Transmission Kikuchi Diffraction) measurements.

"Thinning" is understood to mean a planar ablation of sample material, by way of which the layer thickness of the sample is reduced, for example to make the sample transparent to electron beams. "Polishing" is understood to mean a sample ablation in which sample regions at the surface, which have been damaged by radiation or exhibit other unwanted artifacts, for example, are removed.

BRIEF DESCRIPTION OF THE DRAWINGS

Exemplary embodiments of the disclosure are explained below with reference to figures. Therefore, in order to explain the components, reference is also made to the respectively preceding and subsequent description in its entirety.

EXEMPLARY EMBODIMENTS

Figure 1A:
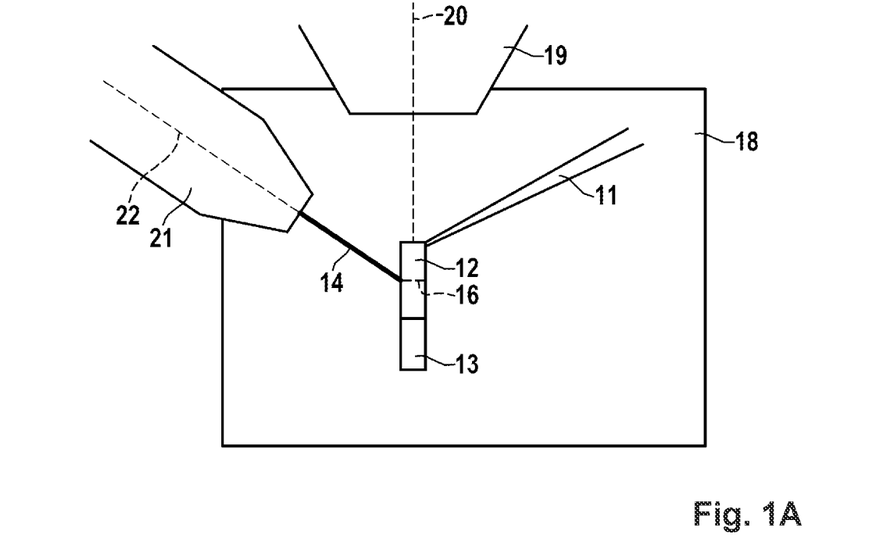
FIGS. 1A-1C schematically show the principle of the method according to the disclosure for changing the spatial orientation of a micro-sample.
Figure 1B:
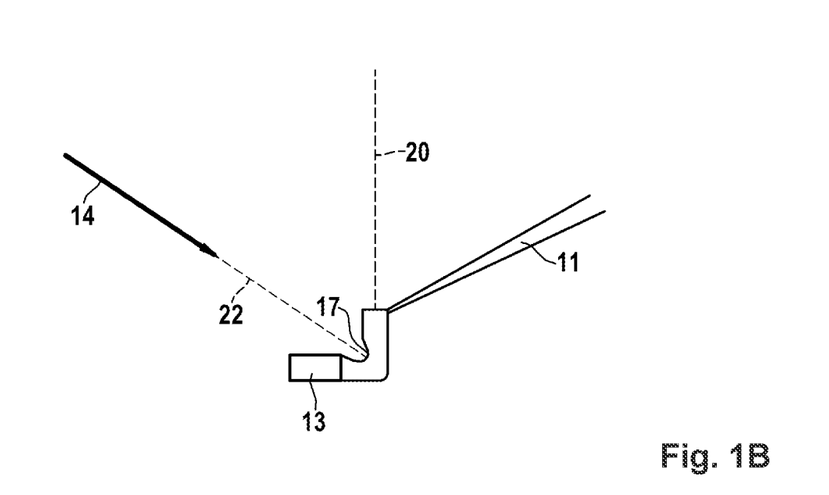
Figure 1C:
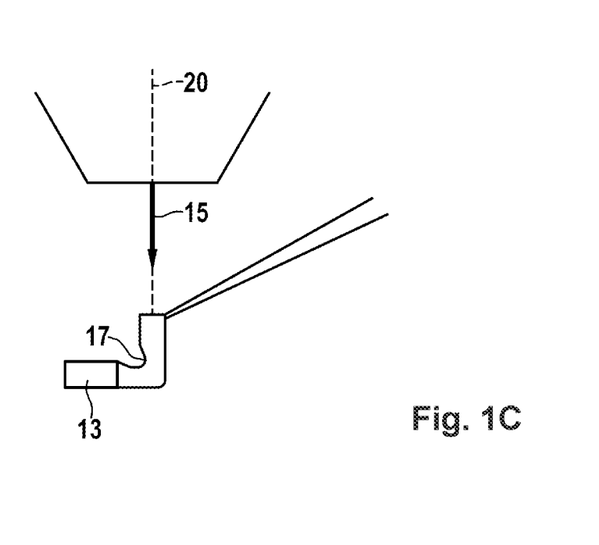

FIGS. 1A-1C show a scheme of the method according to the disclosure. Here, the micro-sample 13 is represented by a flat cuboid, the view being of one of the narrow side faces of the cuboid. Consequently, the planar extent of the micro-sample 13 is arranged perpendicular to the plane of the drawing.

A micro-sample 13 prepared to be free and extracted from an original sample is provided in a microscope system. To this end, the micro-sample 13 and an adjacent hinge element 12 are held on a holding device 11. As illustrated, the holding device 11 can be embodied as the needle of a manipulator, for example.

Advantageously, the holding device 11 is arranged in a sample chamber 18 (not illustrated in FIGS. 1B and 1C) of the microscope system. Vacuum conditions can be provided in the sample chamber 18 during operation. This means that the micro-sample 13 is held in the sample chamber 18 such that the micro-sample 13 can be analyzed and/or processed with the aid of the microscope system.

In the example shown, the hinge element 12 is fastened directly to the manipulator needle 11, for example as a result of adhesion due to electrostatic forces, adhesive bonding (e.g., using a UV-curable adhesive), deposition of material (e.g., by particle beam-induced material deposition), sputtering (application of a sputter coating) or mechanical holding (e.g., with the aid of clamps or grippers).

The micro-sample 13 is arranged directly adjacent to the hinge element 12 such that the micro-sample 13 is held by the manipulator needle 11 via the hinge element 12 (FIG. 1A).

The hinge element 12 provides an additional degree of freedom of movement for the adjacent micro-sample 13. By way of example, it can be embodied as a thin film between micro-sample 13 and holding device 11.

The hinge element 12 has a processing line 16, along which a focused particle beam 14, produced in the microscope system, is guided over the surface of the hinge element 12. By way of example, the particle beam 14 can be an ion beam which is produced in an ion beam column 21. As a result, sample material is ablated, with a bending edge 17 at which the hinge element 12 is shaped arising in the process (FIG. 1B).

In this way, an exposed structure such as the hinge element can be shaped in contactless and permanent fashion. The plastic deformation produced at the processing line is possibly caused by electric charges and/or by thermal effects, which trigger internal tensions.

In any case, shaping the hinge element 12 causes the adjacent micro-sample 13 to be moved in space. That is to say, the spatial orientation of the micro-sample 13 is altered.

The bending edge 17 can be considered to be an axis about which parts of the hinge element 12 and the adjacent micro-sample 13 are rotated. Here, the relative position of this axis of rotation can be chosen freely by virtue of defining a processing line 16 along which the bending edge 17 should arise. The bending edge 17 can be aligned parallel to an outer edge of the TEM lamella, although this is not mandatory.

The hinge element is shaped in contactless fashion. This means that the hinge element does not come into contact with a mechanical shaping tool, either directly or indirectly (e.g., by material deposition). Rather, the shaping is only caused by the action of the focused particle beam, wherein the focused particle beam can be a focused ion beam, for example.

Thus, the micro-sample 13 initially adopts a first spatial orientation relative to the optical axes 20, 22 of the microscope system, as illustrated in FIG. 1A. This first spatial orientation can be chosen as desired.

Following the shaping of the hinge element 12, the micro-sample 13 adopts a second spatial orientation relative to the optical axes 20, 22. Here, it can be particularly advantageous if the second spatial orientation is chosen in such a way that the micro-sample 13 can be observed with the aid of the electron beam 15, which is produced in an electron beam column 19, and a suitable detector (not illustrated). It is also conceivable to choose the second spatial orientation in such a way that the micro-sample 13 can be processed in the microscope system, e.g., by milling (i.e., material ablation by ion irradiation), etching, or material deposition.

However, changing the spatial orientation of the micro-sample can also be brought about by the interplay of beam-induced shaping and mechanical adjustment to the holding device (e.g., manipulator, gripper, sample holder) and/or the adjustment of the beam axis of the incident particle beam. The mechanical adjustment can be implemented in translational and/or rotational fashion.

Moreover, it is also conceivable for a plurality of bending edges to be produced in the hinge element so that the hinge element is shaped at a plurality of points.

Hinge element and micro-sample can be embodied as one piece in a particularly advantageous embodiment In other words: In this case, the hinge element is included by the micro-sample such that hinge element and micro-sample have the same or similar material composition.

Figure 2:
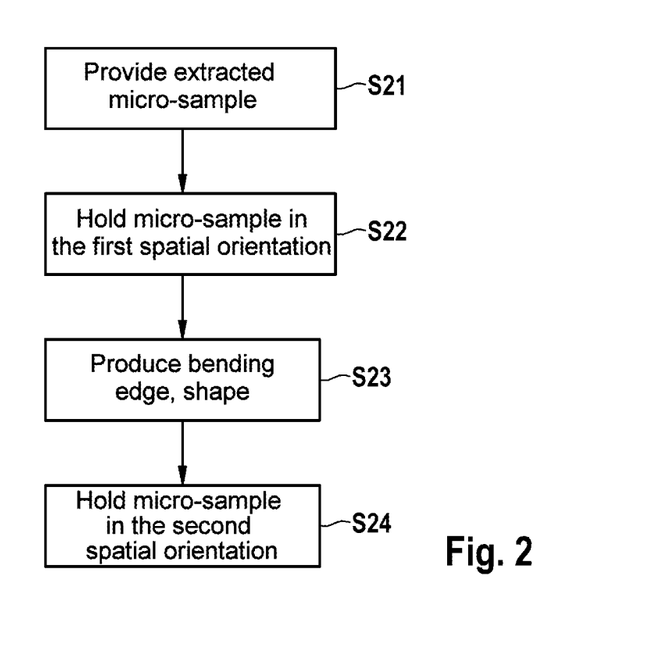
FIG. 2 is the flowchart of an advantageous embodiment of the method.

FIG. 2 is the flowchart of an advantageous embodiment of the method.

Initially (step S21), an extracted micro-sample is provided, which is adjacent to a hinge element and connected via the latter to a holding device. The holding a device can be the needle of a manipulator, a gripper, a sample holder, or a similar tool.

A gripper (e.g., a microgripper) is a pliers- or forceps-like device, with the aid of which a microscopic sample can be grasped and held. A microgripper usually includes two gripping elements. However, it is also conceivable that use is made of clamps which hold the sample without an opening and closing mechanism being present.

A sample holder is understood to mean a device which can receive at least one stub, wherein the stub is configured in such a way that it can hold and provide the sample to be examined. The sample holder is set up to be connected to the microscope system in order to hold the provided sample in the microscope system in such a way that such sample can be examined and/or processed.

Thus, the micro-sample is held by the holding device in a first spatial orientation (step S22) relative to the optical axis or the optical axes of the microscope system. Preferably, the micro-sample in this case is arranged in the sample chamber of the microscope system in such a way that the micro-sample can be analyzed and/or processed without needing to be transferred to another holding device (e.g., outside of the microscope system).

Then a bending edge is produced (step S23) by virtue of the hinge element being irradiated with a beam of charged particles. Advantageously, the bending edge is produced in the hinge element such that the hinge element is shaped, and the micro-sample connected to the hinge element is moved in space.

Finally (step S24), the micro-sample is held in a second spatial orientation. The second spatial orientation facilitates further processing or analyzing of the micro-sample.

Figure 3:
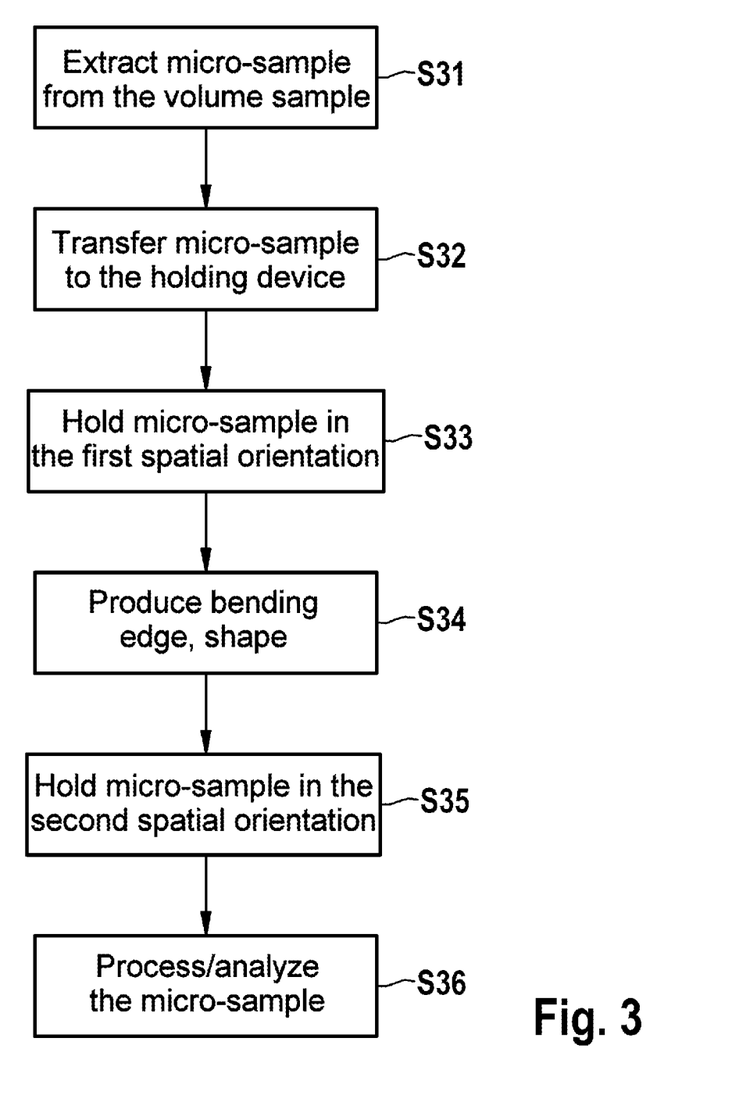
FIG. 3 is the flowchart of a further advantageous embodiment of the method.

A further advantageous embodiment of the method according to the disclosure is illustrated in FIG. 3.

A micro-sample that was prepared from a volume sample (original sample) is initially made available in this embodiment. Various known processes can be used for the preparation. The sample can be a vertical lamella, a horizontal lamella, or a wedge-shaped sample. However, it is also conceivable for the micro-sample to have a column-shaped or conical embodiment or to be embodied as a cone with a polygonal base area. Such sample shapes are used, for example, for tomographic analyses (e.g., x-ray tomography).

In step S31 of the method according to the disclosure, the micro-sample is extracted from the original sample. To this end, the micro-sample is received in a holding device, for example a manipulator needle or a gripper. Then, the micro-sample is separated from the original sample and only still held by the holding device.

Subsequently (step S32), the micro-sample detached from the original sample is transferred to a holding device.

Then, the extracted micro-sample is held in a first spatial orientation in step S33.

A bending edge is produced in the hinge element in step S34, as described for step S23 in FIG. 2.

The micro-sample is held in a second spatial orientation in step S35, the second spatial orientation differing from the first spatial orientation.

Finally, the micro-sample is processed and/or analyzed (step S36).

Figure 4:
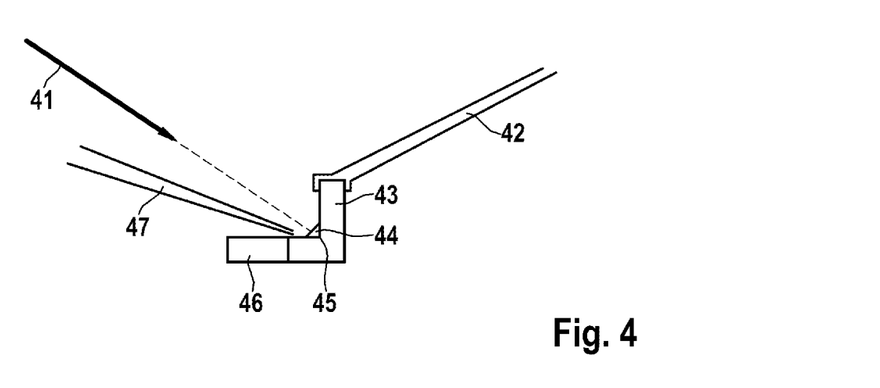
FIG. 4 shows the principle of stabilizing the bending edge.

A further advantageous embodiment is shown in FIG. 4. In each of FIG. 4 and subsequent FIGS. 5 to 8, the micro-sample is illustrated as a flat cuboid, the wide side faces of which are arranged perpendicular to the plane of the drawing. This means that the plan view of a narrow side face of the cuboid is illustrated in each case.

In the embodiment of FIG. 4, a bending edge 45 produced according to the disclosure in the hinge element 43 can be stabilized by virtue of material 44 being deposited on the bending edge 45.

This can be brought about by virtue of a suitable process gas being introduced by a cannula 47 while the micro-sample 46 is held on the holding device 42 (for example by a microgripper). It is also conceivable that a precursor gas is introduced, which is initially activated by irradiation with a particle beam 41 (electrons and/or ions). In any case, the particle beam microscope used to carry out the method should include a device with which the involved gases can be introduced into the vicinity of the bending edge. By way of example, a platinum-containing layer can be applied to the bending edge such that the depression arisen along the processing line is filled and the shaped form is fixed.

Figure 5A:
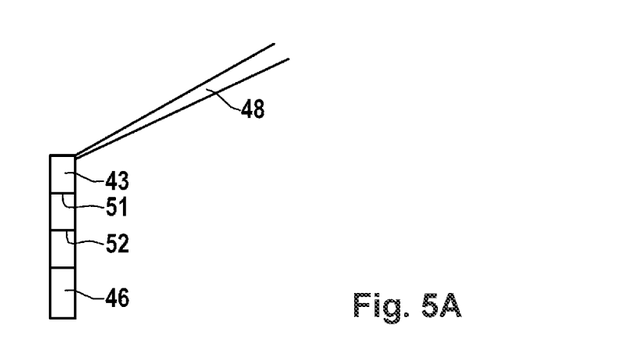
FIGS. 5A-5B show a special embodiment, in which a plurality of bending edges are produced.
Figure 5B:
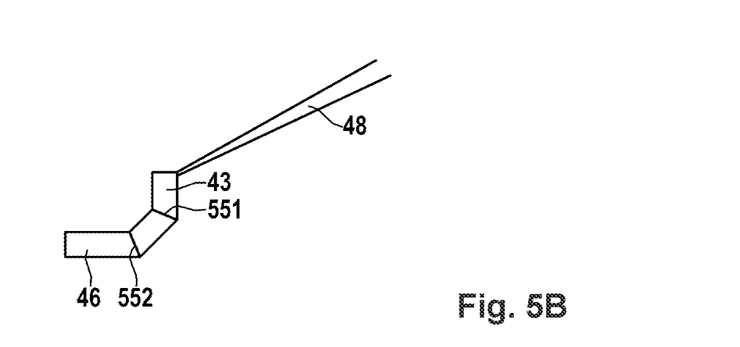

As illustrated in FIGS. 5A-5B, it is furthermore conceivable for the hinge element, which is held by a holding device 48, to have a plurality of processing lines 51, 52 and for the hinge element to be shaped at a number of points (FIG. 5A). Accordingly, a plurality of bending edges 551, 552 are produced in the hinge element. The second spatial orientation of the micro-sample can thus be achieved by virtue of a plurality of instances of shaping of the same hinge element being carried out.

It is also conceivable for different bending edges to be produced in succession in the hinge element in order to successively hold the micro-sample in a plurality of different spatial orientations. While the micro-sample is held in the individual alignments it can be subject to various processing or analysis steps in each case.

The micro-sample is held by a sample receptacle in a further embodiment (FIGS. 6A-6D). The sample receptacle can be embodied as a sample holder or stub.

A sample holder is usually understood to mean a device which can receive one or more sample carriers (stubs) at certain receptacle positions. In turn, the stub conventionally holds one sample directly, for example by way of a clamping mechanism or an adhesively bonded connection. In general, the sample holder can be reversibly fastened to a microscope system, usually on the displaceable microscope stage. Sample holders often have a complex geometry, the configuration of which can vary depending on the examining, processing, or imaging process, the microscope system used and the type of sample.

In a specific configuration of the present disclosure (FIG. 6A), the sample receptacle 61 is embodied as a sample holder, which can directly receive an extracted micro-sample 62. The spatial orientation of a micro-sample 62 held thus can be altered by virtue of the hinge element 63 being shaped along a processing line 64.

Figure 6A:
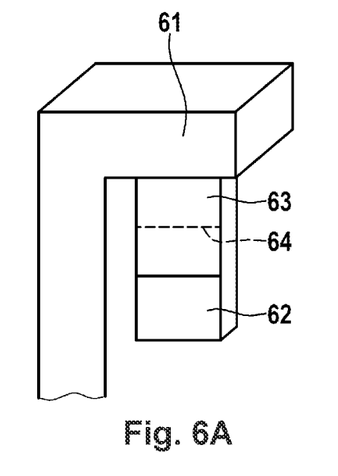
FIGS. 6A-6D show advantageous embodiments, in which the holding device is embodied as a sample holder.
Figure 6B:
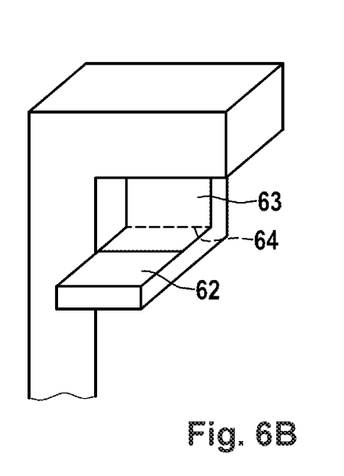
Figure 6C:
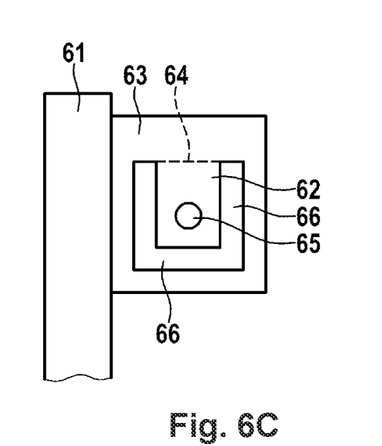
Figure 6D:
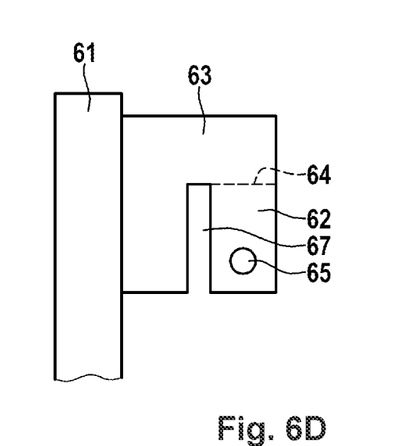

It is also conceivable for the micro-sample to still be included by an original sample, from which it was prepared, and for the entire original sample to be held on the sample receptacle 61.

Advantageously, the sample receptacle can also be configured in such a way that it includes additional storage locations for micro-samples (e.g., TEM lamellas), for example a sample grid. A sample grid is understood to mean a grid-type net or perforated film for receiving a micro-sample. Moreover, specifically prepared areas, specific geometries, or specific orientations of a receptacle region can be made available on the sample receptacle.

To prepare the particle beam-induced shaping according to the disclosure, micro-samples can be exposed from the respective original sample with different types of cut guides.

By way of example, a U-shaped cut 66 can be carried out in order to expose the actual micro-sample 62 from the original sample, as illustrated in FIGS. 6A-6D.

The overall sample includes a hinge element 63 and the actual micro-sample 62, which has a sample region of interest 65. The U-shaped cut 66 is arranged in such a way that the micro-sample 62 is only still connected to the hinge element 63 along a processing line 64. As already described, the hinge element 63 can be shaped in particle beam-induced fashion in order to alter the alignment of the micro-sample 62.

Alternatively, an I-shaped cut 67 can be carried out. The preparation cuts can also be carried out in L-shaped or V-shaped fashion or in the form of a double I or can have any other arrangements. What is common to all these embodiments is that the micro-sample 62 is only connected to the hinge element 63 along a processing line 64 in each case, in order to facilitate the particle beam-induced shaping.

Figure 7A:
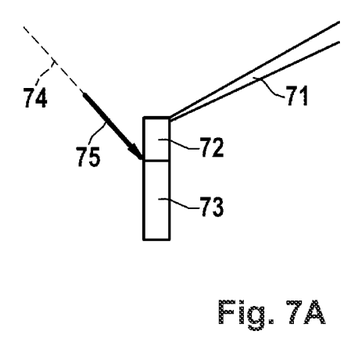
FIGS. 7A-7C show, in exemplary fashion, a method according to the disclosure for thinning and/or polishing the micro-sample.
Figure 7B:
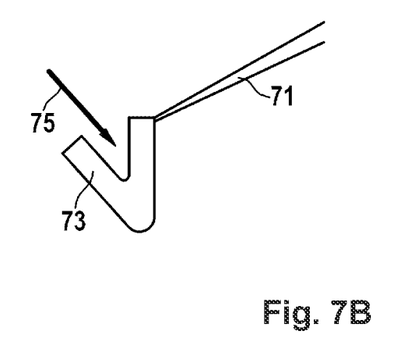
Figure 7C:
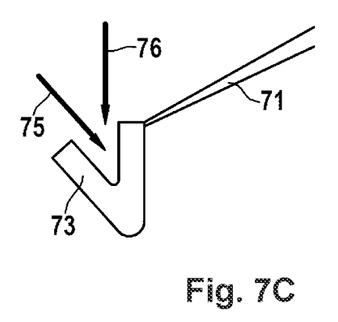

FIGS. 7A-7C schematically show a further advantageous embodiment of the method, by which an extracted micro-sample 73 can be thinned using the focused ion beam. In this embodiment, the second spatial orientation is chosen in such a way that the side faces of the micro-sample which should be processed are aligned substantially parallel to the incident ion beam 74 (and hence to the optical axis 74 of the ion beam column).

A structure to be shaped can be shaped in beam-induced fashion in the direction of the incident particle beam. The shaping can be stopped by virtue of stopping the action of the particle beam. Therefore, it is possible to halt the shaping process once the desired extent of shaping has been achieved.

On the other hand, the structure to be shaped can be shaped at most up to the incident particle beam.

As illustrated in FIG. 7A, this behavior can be exploited by virtue of the hinge element 72 being irradiated and shaped until the adjacent micro-sample 73 is aligned in such a way that the incident ion beam 75 is incident in substantially grazing fashion on the side face of the sample 73 to be processed. Now, the micro-sample 73 can be thinned and/or polished with the aid of the ion beam 75 (FIG. 7B).

By way of example, an electron beam can subsequently pass through the thinned and/or polished micro-sample 73 so that transmitted electrons are captured by a suitable detector and used for image production purposes.

In order to be able to carry out special detection applications, further specific embodiments of the method according to the disclosure, which are illustrated in FIGS. 8A-8E, are conceivable. In this case, the microscope system used to carry out the method includes an EBSD (electron backscattered diffraction) detector 80 and/or a STEM (scanning transmission electron microscopy) detector 800.

Figure 8A:
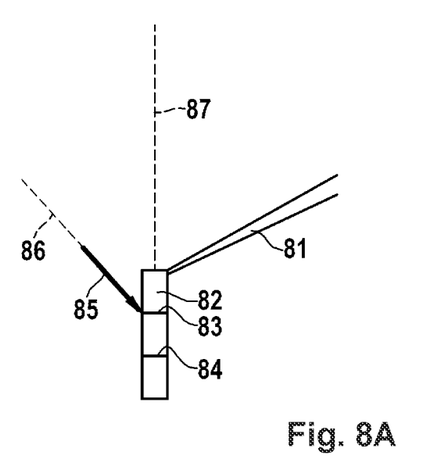
FIGS. 8A-8E show various special embodiments of the method, by which EBSD, TKD, or STEM examinations can be simplified.
Figure 8B:
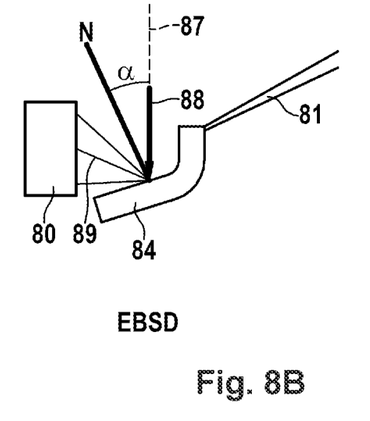
Figure 8C:
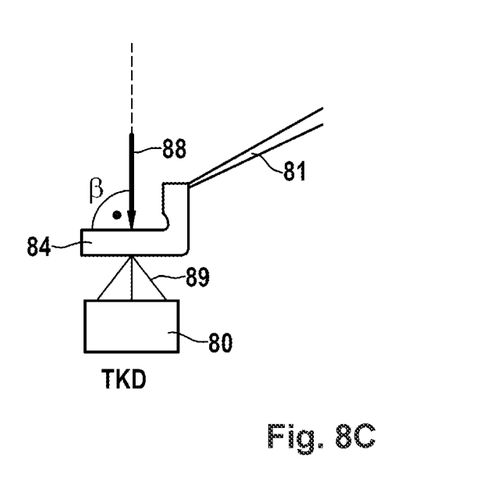
Figure 8D:
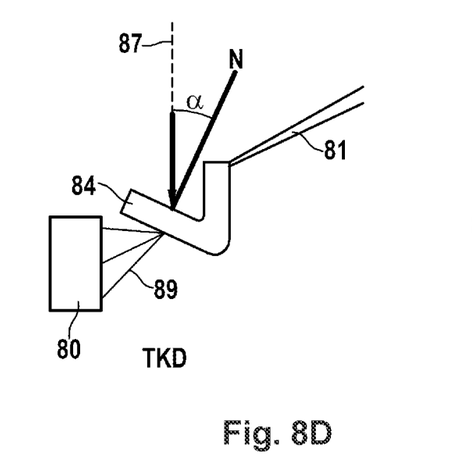

The EBSD detector 80 can be arranged at different positions relative to the optical axes 86, 87 of the microscope system and relative to the micro-sample 84 (as shown in FIGS. 8B to 8D). Thus, arrangements are conceivable in which the EBSD detector 80 is arranged downstream of the micro-sample 84 in the beam path (i.e., on the side facing away from the incident electron beam) or to the side of the micro-sample 84 (i.e., parallel to the optical axis). The STEM detector 800 is usually arranged on the side facing away from the incident electron beam (FIG. 8E) in order to be able to detect electrons that have passed through the sample 94.

In these special embodiments of the method, too, a focused particle beam (for example an ion beam 85) is guided over the hinge element 82 along a processing line 83 such that the hinge element 82 is shaped in particle beam-induced fashion. As a result, the spatial orientation of the adjacent micro-sample 84 is altered relative to the optical axes 86, 87 of the utilized microscope system and relative to the respectively utilized detectors 80, 800. As a result of the particle beam-induced shaping, the micro-sample 84 can be aligned in such a way that, firstly, it can be irradiated with an electron beam 88 and, secondly, signals emitted by the micro-sample 84 can be detected by at least one of the detectors 80, 800.

By way of example, the emitted signal particles can be backscattered electrons (BSE) such that an EBSD (electron backscattered diffraction) analysis is possible (FIG. 8B). The backscattered electrons are released on the side of the micro-sample 84 facing the incident electron beam 88.

Therefore, in a first special embodiment of the method for improved EBSD analysis, the second spatial orientation of the micro-sample 84 is chosen in such a way that the EBSD detector 80 can capture the side of the sample facing the primary electron beam. This ensures that the EBSD detector 80 is able to detect the backscattered electrons which move along the sketched-out trajectories of the signal particles 89.

In this case, the micro-sample 84 can be aligned in such a way that the optical axis 87 and the normal N of the surface of the sample 84 form an angle α, the angular dimension of which is between 0° and 50°. However, it is also conceivable for the surface of the micro-sample 84 to be aligned substantially perpendicular to the optical axis 87 and hence to the incident electron beam 88. In this case, the dimension of the angle β is approximately 90°, wherein the angle β is included by the optical axis 87 and the surface of the sample 84. In this case, the angle α (between normal N of the sample surface and optical axis 87) is 0°.

In a second special embodiment of the method, the signal particles emitted by the sample 84 are transmitted electrons, which can be used for TKD (Transmission Kikuchi Diffraction) measurements. In this case, the incident primary electron beam passes through the sample material and leaves the sample 84 in the form of transmitted electrons. Accordingly, the transmitted electrons emerge on the side of the sample facing away from the primary electron beam.

To detect transmitted electrons, the second spatial orientation of the micro-sample 84 is chosen in such a way in the second special embodiment (TKD analysis) that the EBSD detector 80 can capture the side of the sample facing away from the primary electron beam.

Depending on the arrangement of the EBSD detector 80 relative to the sample 84 and to the optical axis 87, it is advantageous if the area of the sample 84 to be irradiated adopts a certain angle β relative to the incident primary electron beam.

By way of example, if the EBSD detector 80 is arranged on the side facing away from the electron beam 88 (FIG. 8C), it is advantageous if the area of the micro-sample 84 to be irradiated is aligned substantially perpendicular to the incident primary electron beam 88. In this case, the dimension of the angle β is approximately 90°.

In the case of a lateral arrangement of the EBSD detector 80, it is advantageous, however, to tilt the micro-sample 84, as illustrated in FIG. 8D. In this case, the sample 84 can be oriented in such a way that the optical axis 87 and the normal N of the surface of the sample 84 form an angle α, the angular dimension of which is between 0° and 30°. An angle α of approximately 10° was found to be particularly advantageous.

Figure 8E:
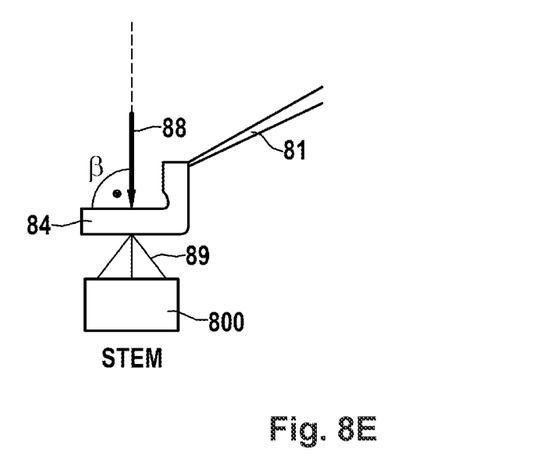

A third special embodiment of the method can be used for transmission examinations using a scanning electron beam microscope. Transmitted electrons are also detected in this case. The microscope system used includes a STEM detector 800 for detecting transmission electrons. The STEM detector 800 is arranged on the side of the sample facing away from the incident primary particle beam. In this case, too, it can be particularly advantageous if the area of the micro-sample 84 to be irradiated is arranged substantially perpendicular to the incident primary electron beam such that the angle β is approximately 90°.

Moreover, other tilt angles in which the involved degrees of freedom of movement are made available by additional tilt devices are also conceivable in all special embodiments described.

Figure 9:
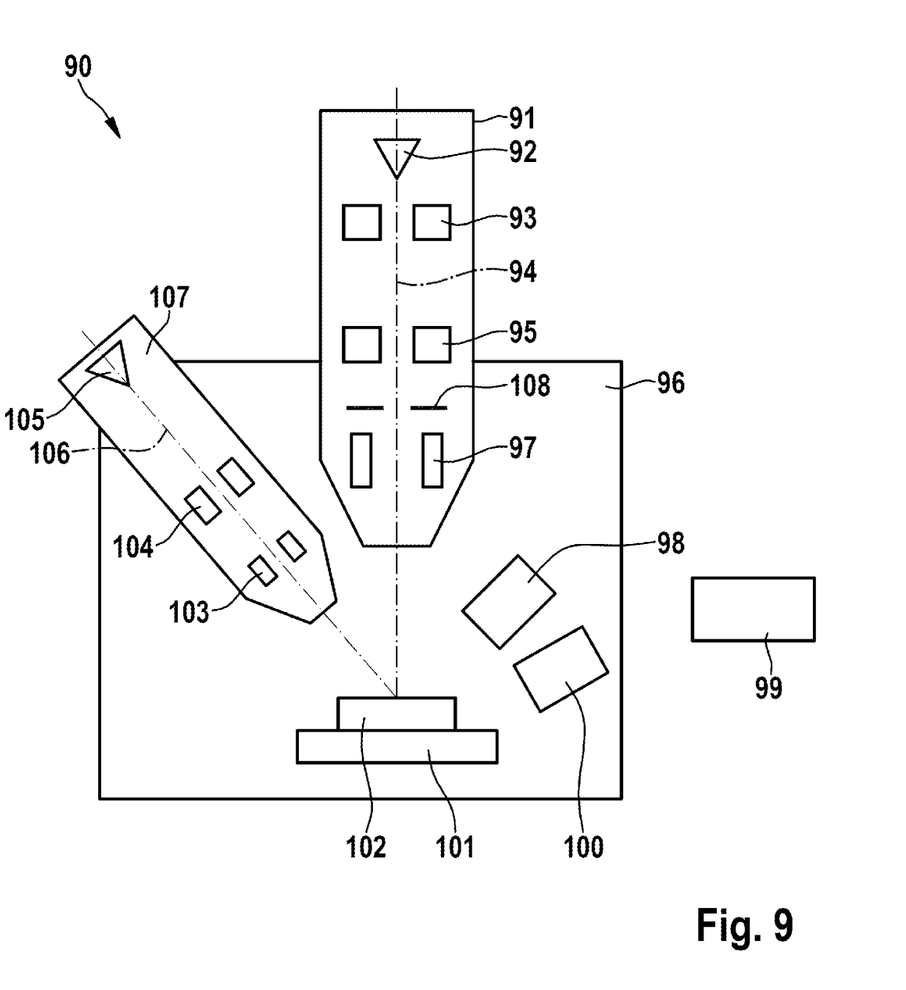
FIG. 9 shows a microscope system (two-beam apparatus), which is set up to carry out the method according to the disclosure.

Advantageously, the various embodiments of the method according to the disclosure are carried out with a two-beam apparatus (FIB-SEM combination apparatus), which is illustrated in FIG. 9. The two-beam apparatus 90 includes two particle beam columns, specifically an electron beam column 91 for producing an electron beam and an ion beam column 107 for producing an ion beam. Both particle beams are directed at the processing location on the micro-sample 102, which advantageously is situated at the coincidence point of both particle beams.

Usually, the micro-sample 102 is received in a sample stage 101 for this purpose and is located in the sample chamber 96 of the two-beam apparatus 90, in which there are vacuum conditions.

The sample stage 101 is advantageously embodied as a five-axis sample stage. This means that the sample receptacle can be displaced in the x-, y- and z-direction—i.e., in three mutually perpendicular spatial directions—and can be rotated about a tilt axis and an axis of rotation. Optionally, further movement axes may be present.

By way of example, the axis of rotation can be aligned perpendicular to one of the spatial directions. The rotation about the tilt axis, which extends perpendicular to a plane spanned by the optical axes 94, 106 (i.e., perpendicular to the plane of the drawing), renders it possible to allow the surface of the sample 102, which is intended to be irradiated by charged particles, to adopt different adjustable angles in relation to the optical axes 94, 106.

Consequently, five degrees of freedom of movement, specifically three translational and two rotational degrees of freedom of movement, are made available for the received micro-sample 102. An additional degree of freedom of movement can be provided by the inventive, ion beam-induced reshaping of a hinge element adjacent to the micro-sample 102. Further degrees of freedom of movement can be provided by the sample holder, manipulator and/or gripper.

During the operation of the two-beam apparatus 90, primary electrons are produced in the electron source 92 and the electrons are accelerated along the optical axis 94 of the electron beam column 91, focused by the lens systems 93, 95, and clipped by at least one aperture stop 108. Moreover, the electron beam column 91 includes a deflection system 97, by which the primary electron beam can be guided over the sample 102 in a grid-like fashion. Furthermore, the FIB-SEM combination apparatus 90 includes at least one detector 98 for detecting interaction products of the interaction of the electrons and/or ions with the sample 102.

In a particularly advantageous configuration of the two-beam apparatus, the objective lens can be arranged at the sample-side end of the electron beam column and includes the deflection system.

Moreover, the FIB-SEM combination apparatus 90 includes an ion beam column 107 with an ion source 105, a deflection system 104 and focusing lenses 103. The ions produced in the ion source 105 are accelerated along the optical axis 106 of the ion beam column 107 and focused such that the ions are incident on the sample 102 in focus and can be used to ablate material from the sample 102 and/or image the sample 102.

It can be particularly advantageous for the two-beam apparatus 90 to moreover include a gas injection system (GIS) 100. The latter usually includes a reservoir for a process gas which can be supplied in a controlled fashion to the sample 102 via a line that ends near the processing location. The process gas can be embodied as a precursor gas. In this case, the precursor gas is initially activated by the ion beam or the electron beam and thus converted into a reactive form that is able to ablate sample material or deposit material on the sample 102. With the aid of a suitable detector 98, the progress of the processing of the sample 102 can be observed simultaneously or successively by way of irradiation with electrons.

Moreover, the two-beam apparatus 90 can include an evaluation and control unit 99. The evaluation and control unit 99 can carry out a sequence of control commands, which are included in a computer program product. By carrying out the control commands, the two-beam apparatus 90 is prompted to carry out an embodiment of the method according to the disclosure for changing the spatial orientation of a micro-sample.

This is not restricted to a two-beam apparatus. Other particle beam apparatuses used to carry out the method according to the disclosure can be prompted by way of an appropriate computer program product to carry out a sequence of control commands such that an above-described method for changing the spatial orientation of a micro-sample is carried out.

REFERENCE SIGNS

11 Holding device (manipulator needle)
12 Hinge element
13 Micro-sample
14 Focused ion beam
15 Electron beam
16 Processing line
17 Bending edge
18 Sample chamber
19 Electron beam column
20 Optical axis of the electron beam column
21 Ion beam column
22 Optical axis of the ion beam column
S21 Provide extracted micro-sample
S22 Hold micro-sample in the first spatial orientation
S23 Produce bending edge
S24 Hold micro-sample in the second spatial orientation
S31 Extract micro-sample from the original sample (volume sample)
S32 Transfer micro-sample to the holding device
S33 Hold micro-sample in the first spatial orientation
S34 Produce bending edge and shape
S35 Hold micro-sample in the second spatial orientation
S36 Process/analyze micro-sample
41 Particle beam
42 Gripper (e.g., microgripper)
43 Hinge element
44 Deposited material
45 Bending edge
46 Micro-sample
47 Cannula (gas injection system)
48 Holding device
51 First processing line
52 Second processing line
551 First bending edge
552 Second bending edge
61 Sample receptacle
62 Micro-sample
63 Hinge element
64 Processing line
65 Sample region of interest
66 U-shaped cut
67 I-shaped cut
71 Holding device
72 Hinge element
73 Micro-sample
74 Optical axis
75 Ion beam
76 Electron beam
80 EBSD detector
81 Holding device
82 Hinge element
83 Processing line
84 Micro-sample
85 Ion beam
86 First optical axis
87 Second optical axis
88 Electron beam 89 Trajectories of the signal particles
800 STEM detector
N Normal of the surface of the sample
90 Two-beam apparatus
91 Electron beam column
92 Electron source
93 First condenser lens system
94 Optical axis of the electron beam column
95 Second condenser lens system
96 Sample chamber
97 Deflection system
98 Detector
99 Evaluation and control unit
100 Gas injection system
101 Sample stage
102 Micro-sample
103 Focusing lens
104 Deflection system
105 Ion source
106 Optical axis of the ion beam column
107 Ion beam column
108 Aperture stop

What is claimed is:

1. A method, comprising:
a) holding an extracted micro-sample and an adjacent hinge element via a holding device of a particle beam microscope so that the micro-sample has a first spatial orientation relative to an optical axis of a particle beam column of the particle beam microscope;
b) producing a bending edge in the hinge element via irradiation with a beam of charged particles produced by the particle beam column to move the micro-sample in space to change its spatial orientation; and
c) holding the micro-sample in a second spatial orientation relative to the optical axis the particle beam microscope,
wherein the second spatial orientation is different from the first spatial orientation.

2. The method of claim 1, further comprising extracting the micro-sample from an original sample.

3. The method of claim 1, further comprising transferring the micro-sample to the holding device.

4. The method of claim 1, further comprising processing the micro-sample and/or analyzing the micro-sample.

5. The method of claim 1, wherein the holding device comprises a member selected from the group consisting of a manipulator needle, a gripper, and a sample receptacle.

6. The method of claim 1, wherein b) comprises producing a plurality of bending edges in the hinge element.

7. The method of claim 1, further comprising depositing material on the bending edge to stabilize the bending edge.

8. The method of claim 1, wherein the hinge element and micro-sample are a single piece.

9. The method of claim 1, wherein
the particle beam column comprises an electron beam column configured to produce an electron beam; and
the second spatial orientation of the micro-sample is such that a side face of the micro-sample to be examined is substantially perpendicular to the optical axis of the electron beam column.

10. The method of claim 1, wherein:
the particle beam column comprises an ion beam column configured to produce a focused ion beam;
the second spatial orientation of the micro-sample is such that a side face of the micro-sample to be examined is substantially parallel to the optical axis of the ion beam column; and
the method further comprises using the focused ion beam to thin and/or polish the micro-sample.

11. The method of claim 1, wherein:
the particle beam column comprises an electron beam column configured to produce an electron beam;
the particle beam microscope further comprises an electron backscatter diffraction detector; and
the method further comprises choosing the second spatial orientation of the micro-sample to perform Transmission Kikuchi Diffraction measurements of the micro-sample.

12. The method of claim 11, wherein the optical axis of the electron beam column and a normal of a surface of the micro-sample to be examined define an angle of from 0° to 30°.

13. The method of claim 11, wherein the optical axis of the electron beam column and a normal of a surface of the micro-sample to be examined define an angle that of 10°.

14. The method of claim 1, wherein:
the particle beam column comprises an electron beam column configured to produce an electron beam;
the particle beam microscope further comprises an electron backscatter diffraction; and
the method further comprises choosing the second spatial orientation of the micro-sample to perform electron backscatter diffraction analyses of the micro-sample.

15. The method of claim 14, wherein the optical axis of the electron beam column and a normal of a surface of the micro-sample to be examined define an angle of from 0° to 50°.

16. The method of claim 1, wherein:
the particle beam microscope comprises a scanning transmission electron microscopy detector; and
the method further comprises choosing the second spatial orientation of the micro-sample so that STEM analyses can be carried out.

17. One or more machine-readable hardware storage devices comprising instructions that are executable by one or more processing devices to perform operations comprising the method of claim 1.

18. A system comprising:
one or more processing devices; and
one or more machine-readable hardware storage devices comprising instructions that are executable by the one or more processing devices to perform operations comprising the method of claim 1.

19. A method, comprising:
a) holding an extracted micro-sample and an adjacent hinge element via a holding device of an electron beam microscope so that the micro-sample has a first spatial orientation relative to an optical axis of an electron beam column of the electron beam microscope;
b) producing a bending edge in the hinge element via irradiation with a beam of electrons produced by the electron beam column to move the micro-sample in space to change its spatial orientation;
c) holding the micro-sample in a second spatial orientation relative to the optical axis the particle beam microscope; and
d) after c), processing the micro-sample and/or analyzing the micro-sample,
wherein the second spatial orientation is different from the first spatial orientation.

20. A method, comprising:
a) holding an extracted micro-sample and an adjacent hinge element via a holding device of an ion beam microscope so that the micro-sample has a first spatial orientation relative to an optical axis of an ion beam column of the ion beam microscope;

b) producing a bending edge in the hinge element via irradiation with a beam of ions produced by the ion beam column to move the micro-sample in space to change its spatial orientation;

c) holding the micro-sample in a second spatial orientation relative to the optical axis the particle beam microscope; and d) after c), processing the micro-sample and/or analyzing the micro-sample, wherein the second spatial orientation is different from the first spatial orientation.

\* \* \* \* \*

UNITED STATES PATENT AND TRADEMARK OFFICE
CERTIFICATE OF CORRECTION

| | | |
|---|---|---|
| PATENT NO. | : 11,355,310 B2 | Page 1 of 1 |
| APPLICATION NO. | : 17/203095 | |
| DATED | : June 7, 2022 | |
| INVENTOR(S) | : Doemer et al. | |

It is certified that error appears in the above-identified patent and that said Letters Patent is hereby corrected as shown below:

In the Claims

Column 13, Line 35, Claim 1, delete "axis" insert -- axis of --.

Column 14, Line 58, Claim 19, delete "axis" insert -- axis of --.

Column 15, Line 8, Claim 20, delete "axis" insert -- axis of --.

Signed and Sealed this
Nineteenth Day of July, 2022

Katherine Kelly Vidal
*Director of the United States Patent and Trademark Office*